(12) United States Patent
Kim et al.

(10) Patent No.: US 6,509,232 B1
(45) Date of Patent: Jan. 21, 2003

(54) FORMATION OF STI (SHALLOW TRENCH ISOLATION) STRUCTURES WITHIN CORE AND PERIPHERY AREAS OF FLASH MEMORY DEVICE

(75) Inventors: Unsoon Kim, Santa Clara, CA (US); Mark S. Chang, Los Altos, CA (US); Yider Wu, Campbell, CA (US); Chi Chang, Redwood City, CA (US); Angela Hui, Fremont, CA (US); Yu Sun, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/969,573

(22) Filed: Oct. 1, 2001

(51) Int. Cl.[7] .............................................. H01L 21/336
(52) U.S. Cl. ....................... 438/264; 438/241; 438/257; 438/424; 438/435; 438/436; 438/437
(58) Field of Search ................................. 438/264, 257, 438/241, 424, 435, 436, 437

(56) References Cited

PUBLICATIONS

Y. Takeuchi et al., A Self–Aligned STI Process Integration for Low Cost and Highly Reliable 1 Gbit Flash Memories, IEEE 1998 Symposium on VLSI Technology Digest of Technical Papers, pp. 102–103.

*Primary Examiner*—Long Pham
(74) *Attorney, Agent, or Firm*—Monica H. Choi

(57) ABSTRACT

STI (shallow trench isolation) structures are formed for a flash memory device fabricated within an semiconductor substrate comprised of a core area having an array of core flash memory cells fabricated therein and comprised of a periphery area having logic circuitry fabricated therein. A first set of STI (shallow trench isolation) openings within the core area are etched through the semiconductor substrate, and a second set of STI (shallow trench isolation) openings within the periphery area are etched through the semiconductor substrate. A core active device area of the semiconductor substrate within the core area is surrounded by the first set of STI openings, and a periphery active device area of the semiconductor substrate within the periphery area is surrounded by the second set of STI openings. Dielectric liners are formed at sidewalls of the first and second sets of STI openings with reaction of the semiconductor substrate at the sidewalls of the STI openings such that top corners of the semiconductor substrate of the core and periphery active device areas adjacent the STI openings are rounded. A trench dielectric material is deposited to fill the STI openings. In addition, the top corners of the periphery active device area are exposed by etching portions of the sidewalls of the second set of STI structures in a dip-off etch. The exposed top corners of the periphery active device area are further rounded after additional thermal oxidation of the exposed top corners of the periphery active device area. The rounded corners of the core and periphery active device areas result in minimized leakage current through a flash memory cell fabricated within the core active device area and through a MOSFET fabricated within the periphery active device area.

20 Claims, 15 Drawing Sheets

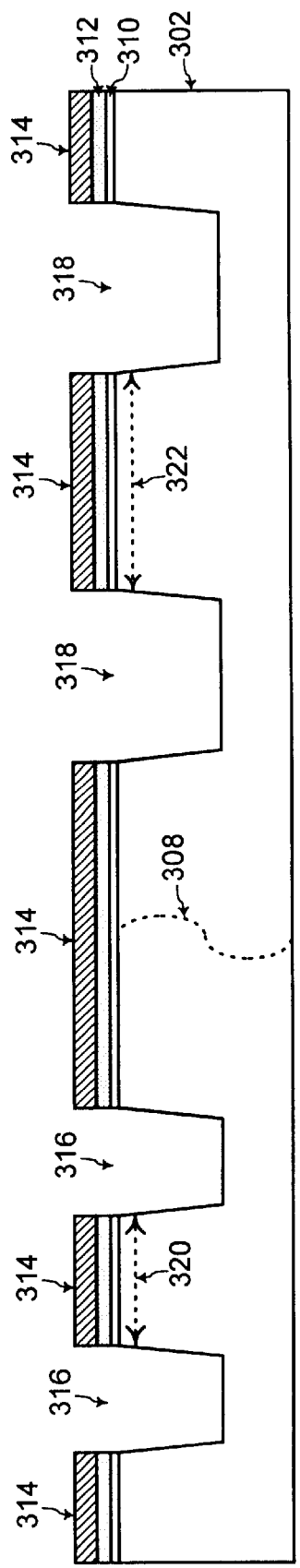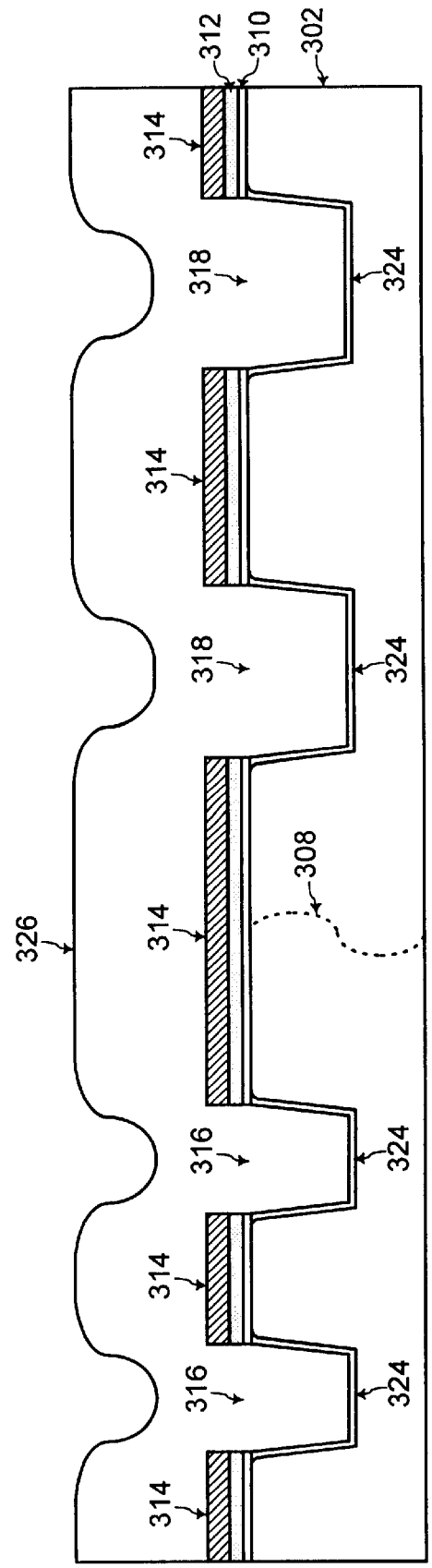

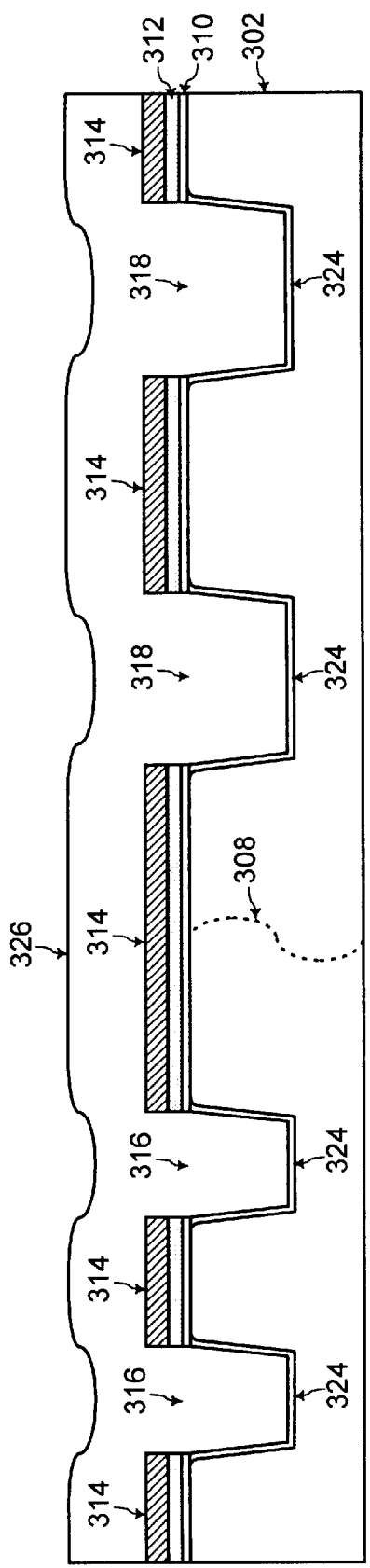
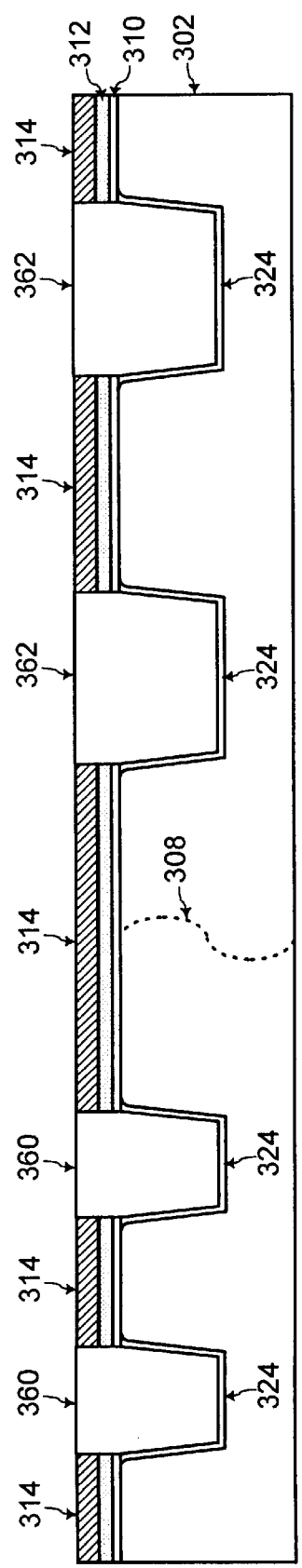
FIG. 12
FIG. 13

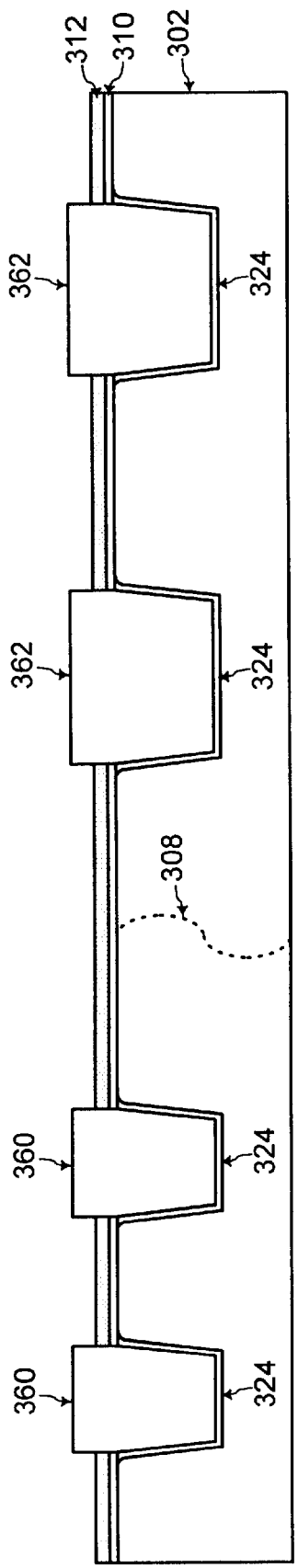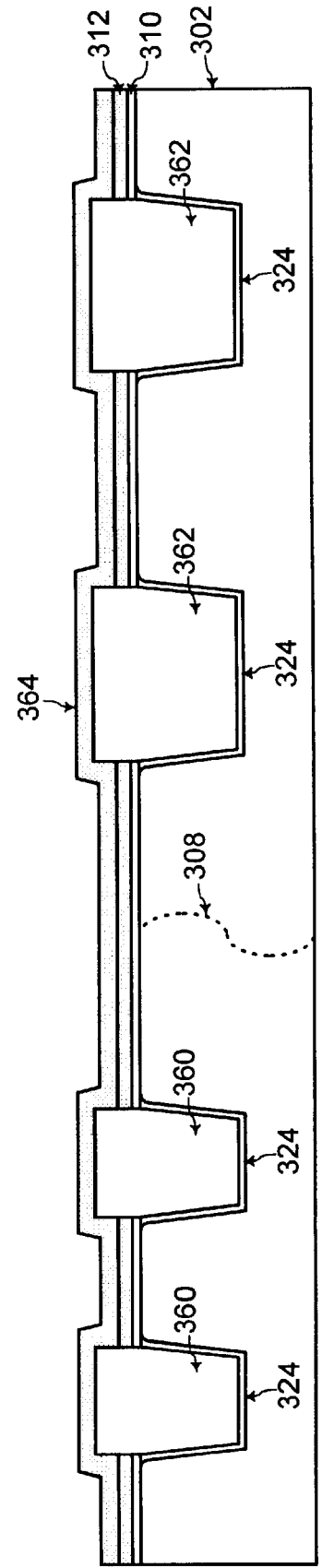

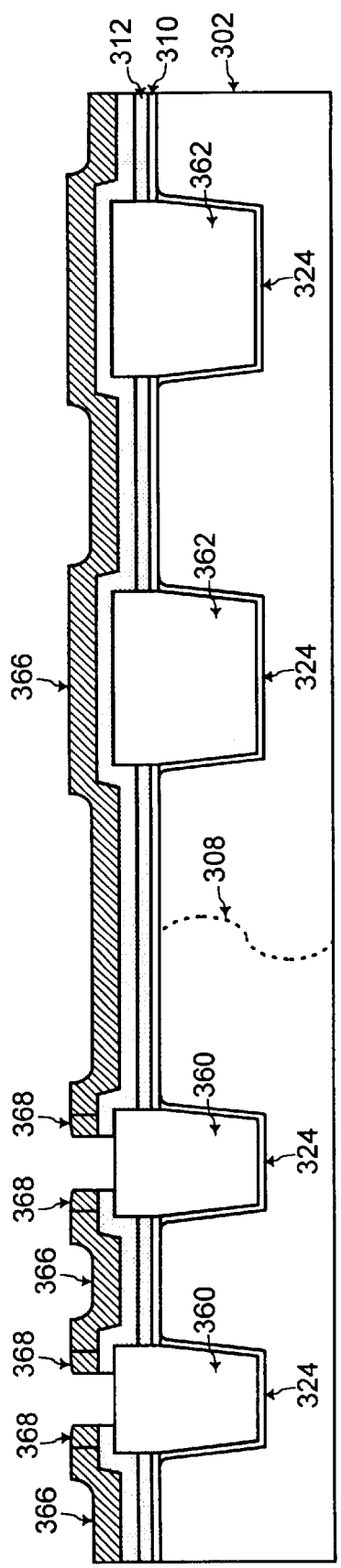
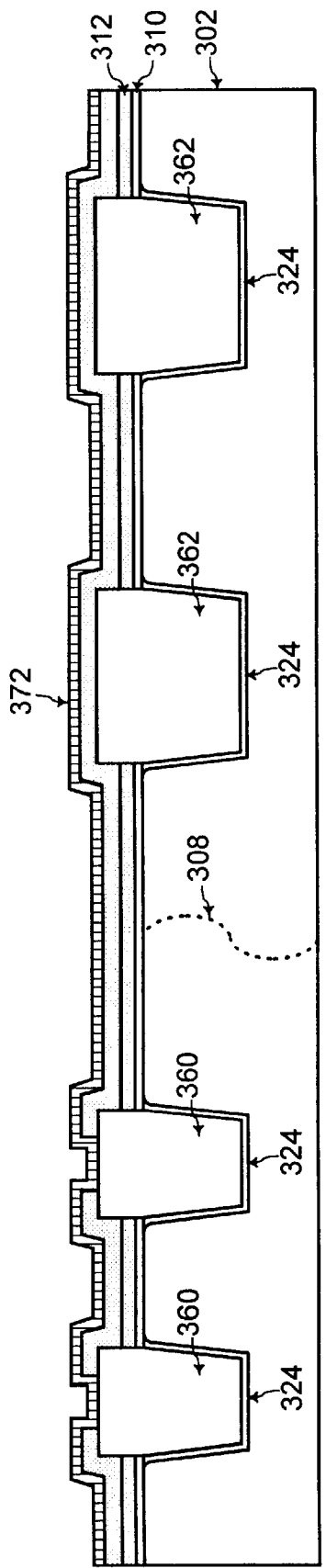
FIG. 18
FIG. 19

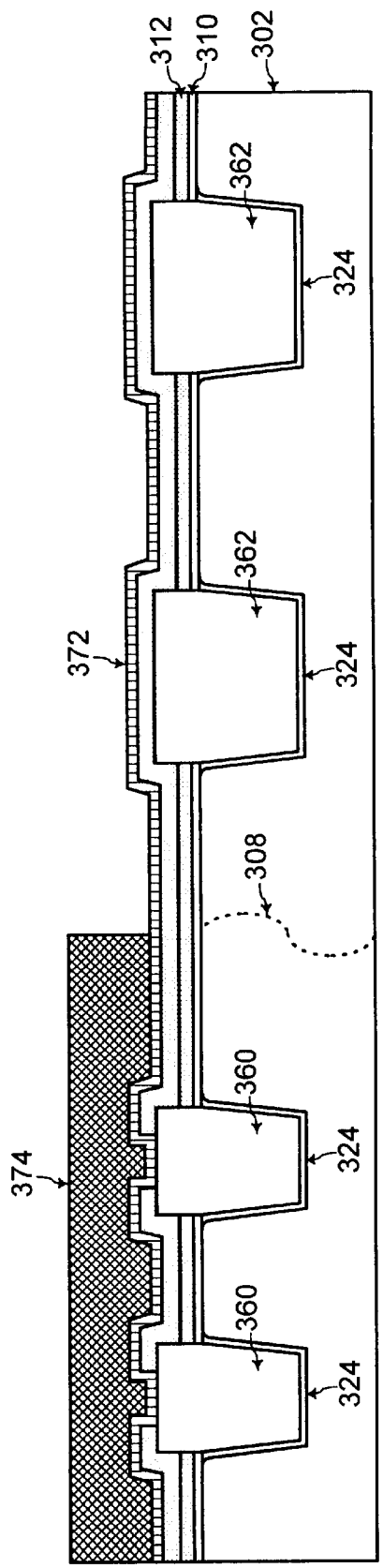
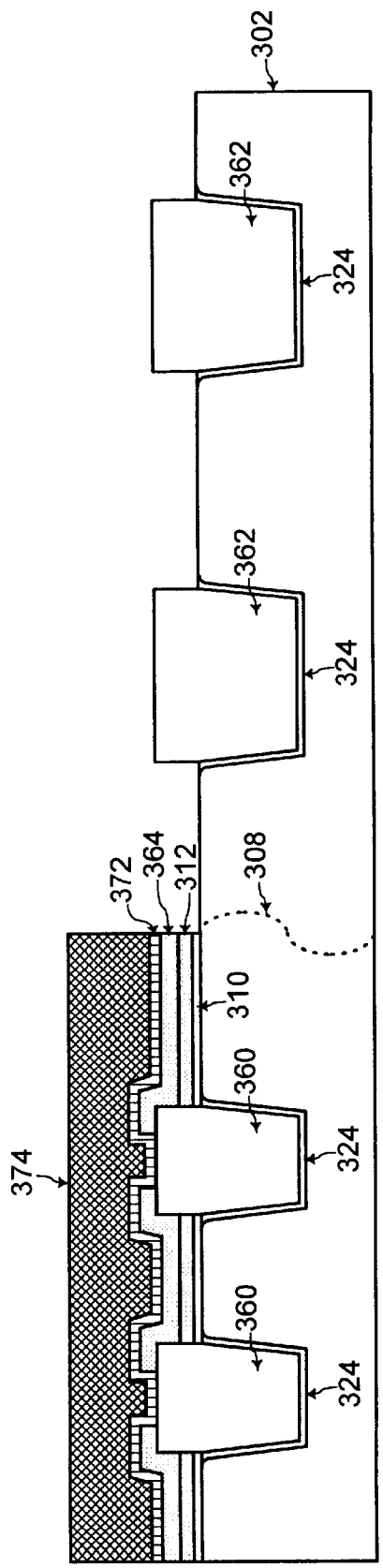
FIG. 20
FIG. 21

US 6,509,232 B1

FORMATION OF STI (SHALLOW TRENCH ISOLATION) STRUCTURES WITHIN CORE AND PERIPHERY AREAS OF FLASH MEMORY DEVICE

TECHNICAL FIELD

The present invention relates generally to flash memory devices, and more particularly, to a method for forming STI (shallow trench isolation) structures within the core and periphery areas of a flash memory device with rounding at corners of the semiconductor substrate adjacent the STI structures and with preservation of the integrity of the tunnel dielectric of the core flash memory cells.

BACKGROUND OF THE INVENTION

Referring to FIG. 1, a flash memory cell 100 of a flash memory device includes a tunnel dielectric 102 typically comprised of silicon dioxide ($SiO_2$) or nitrided oxide as known to one of ordinary skill in the art of integrated circuit fabrication. The tunnel dielectric 102 is disposed on a core active device area 103 of a semiconductor substrate or a p-well. In addition, a floating gate 104, comprised of a conductive material such as polysilicon for example, is disposed over the tunnel dielectric 102. A floating dielectric 106, typically comprised of silicon dioxide ($SiO_2$) or ONO (a sandwich of oxide-nitride-oxide, as known to one of ordinary skill in the art of integrated circuit fabrication), is disposed over the floating gate 104. A control gate 108, comprised of a conductive material such as polysilicon, is disposed over the floating dielectric 106.

A drain bit line junction 110 that is doped with a junction dopant, such as arsenic (As) or phosphorous (P) for example, is formed within the core active device area 103 of the semiconductor substrate or p-well toward a left sidewall of the floating gate 104 in FIG. 1. A source bit line junction 114 that is doped with the junction dopant is formed within the core active device area 103 of the semiconductor substrate or p-well 106 toward a right sidewall of the floating gate 104 of FIG. 1. The core active device area 103 is defined by surrounding STI (shallow trench isolation) structures 109 comprised of an insulating material such as silicon dioxide ($SiO_2$) for example. Such a flash memory cell 100 comprising a flash memory device is known to one of ordinary skill in the art of integrated circuit fabrication.

During the program or erase operations of the flash memory cell 100 of FIG. 1, charge carriers are injected into or injected out of the floating gate 104. Such variation of the amount of charge carriers within the floating gate 104 alters the threshold voltage of the flash memory cell 100, as known to one of ordinary skill in the art of flash memory technology. For example, when electrons are the charge carriers that are injected into the floating gate 104, the threshold voltage increases. Alternatively, when electrons are the charge carriers that are injected out of the floating gate 104, the threshold voltage decreases. These two conditions are used as the two states for storing digital information within the flash memory cell 100, as known to one of ordinary skill in the art of electronics.

During programming of the flash memory cell 100 for example, a voltage of +9 Volts is applied on the control gate 108, a voltage of +5 Volts is applied on the drain bit line junction 110, and a voltage of 0 Volts is applied on the source bit line junction 114 and on the semiconductor substrate or p-well 103. With such bias, when the flash memory cell 100 is an N-channel flash memory cell, electrons are injected into the floating gate 104 to increase the threshold voltage of the flash memory cell 100 during programming of the flash memory cell 100.

Alternatively, during erasing of the flash memory cell 100, a voltage of −9.5 Volts is applied on the control gate 108, a voltage of 0 Volts is applied on the drain bit line junction 110, and a voltage of +4.5 Volts is applied on the source bit line junction 114 and on the semiconductor substrate or p-well 103 for example. With such bias, when the flash memory cell 100 is an N-channel flash memory cell, electrons are pulled out of the floating gate 104 to decrease the threshold voltage of the flash memory cell 100 during erasing of the flash memory cell 100. Such an erase operation is referred to as an edge erase process by one of ordinary skill in the art of flash memory technology.

In an alternative channel erase process, a voltage of −9.5 Volts is applied on the control gate 108 and a voltage of +9 Volts is applied on the semiconductor substrate or p-well 103 with the drain and source bit line junctions 110 and 114 floating. With such bias, when the flash memory cell 100 is an N-channel flash memory cell, electrons are pulled out of the floating gate 104 to the substrate or p-well 103 to decrease the threshold voltage of the flash memory cell 100 during erasing of the flash memory cell 100.

FIG. 2 illustrates an example semiconductor die 150 having a flash memory device fabricated thereon. The flash memory device includes a core area 152 having an array of flash memory cells fabricated thereon and a periphery area 154 having logic circuitry fabricated thereon, as known to one of ordinary skill in the art of flash memory devices. FIG. 3 illustrates the array of flash memory cells fabricated in the core area 152, as known to one of ordinary skill in the art of flash memory technology. Referring to FIG. 3, the array of flash memory cells 200 includes rows and columns of flash memory cells with each flash memory cell having similar structure to the flash memory cell 100 of FIG. 1. The array of flash memory cells 200 of FIG. 3 is illustrated with 2 columns and 2 rows of flash memory cells for simplicity and clarity of illustration. However, a typical array of flash memory cells comprising an electrically erasable and programmable memory device has more numerous rows and columns of flash memory cells such as 512 rows and 512 columns of flash memory cells for example.

Further referring to FIG. 3, in the array of flash memory cells 200, the control gate terminals of all flash memory cells in a row of the array are coupled together to form a respective word line for that row. In FIG. 3, the control gate terminals of all flash memory cells in the first row are coupled together to form a first word line 202, and the control gate terminals of all flash memory cells in the second row are coupled together to form a second word line 204. In addition, the drain terminals of all flash memory cells in a column are coupled together to form a respective bit line for that column. In FIG. 3, the drain terminals of all flash memory cells in the first column are coupled together to form a first bit line 206, and the drain terminals of all flash memory cells in the second column are coupled together to form a second bit line 208. Further referring to FIG. 3, the source terminal of all flash memory cells of the array 200 are coupled together to a source voltage $V_{SS}$, and the substrate or p-well terminal of all flash memory cells of the array 200 are coupled together to a substrate voltage $V_{SUB}$.

Referring to FIGS. 2 and 4, the logic circuitry of the periphery area 154 is comprised of conventional MOSFETs (metal oxide semiconductor field effect transistor) 250. The conventional MOSFET 250 includes a gate dielectric 252 typically comprised of silicon dioxide ($SiO_2$) formed over a periphery active device area 254 of a semiconductor substrate or a p-well. In addition, a gate structure 256, comprised of a conductive material such as polysilicon, is disposed over the gate dielectric 252.

A drain junction 258 that is doped with a junction dopant, such as arsenic (As) or phosphorous (P) for example, is formed within the active device area 254 of the semiconductor substrate or p-well toward a left sidewall of the gate structure 256. A source junction 260 that is doped with the junction dopant is formed within the active device area 254 of the semiconductor substrate or p-well toward a right sidewall of the gate structure 256. The periphery active device area 254 is defined by surrounding STI (shallow trench isolation) structures 262 comprised of an insulating material such as silicon dioxide ($SiO_2$) for example. Such a structure of the conventional MOSFET 250 comprising the logic circuitry of the periphery area 154 is known to one of ordinary skill in the art of integrated circuit fabrication.

Referring to FIG. 1, top corners 120 of the core active device area 103 are adjacent the first STI structures 109 surrounding the core active device area 103. Similarly, referring to FIG. 4, top corners 264 of the periphery active device area 254 are adjacent the second STI structures 262 surrounding the periphery active device area 254. During operation of the flash memory cell 100 and the MOSFET 250, relatively high voltages may be applied on the drain and source bit line junctions 110 and 114 of the flash memory cell 100 and on the drain and source junctions 258 and 260 of the MOSFET 250. With such high voltages, a higher leakage current undesirably flows through the drain and source bit line junctions 110 and 114 of the flash memory cell 100 when the top corners 120 of the core active device area 103 adjacent the first STI structures 109 are sharper corners. Similarly, with such high voltages, a higher leakage current undesirably flows through the drain and source junctions 258 and 260 of the MOSFET 250 when the top corners 264 of the periphery active device area 254 adjacent the second STI structures 262 are sharper corners.

Thus, a mechanism is desired for forming STI structures within the core area and within the periphery area with rounded top corners of the core active device area 103 and the periphery active device area 254 to minimize undesired leakage current.

SUMMARY OF THE INVENTION

Accordingly, in a general aspect of the present invention, STI structures are formed surrounding a core active device area and a periphery active device area of a flash memory device with rounded corners of the core active device area and the periphery active device area to minimize undesired leakage current.

In one embodiment of the present invention, STI (shallow trench isolation) structures are formed for a flash memory device fabricated within a semiconductor substrate comprised of a core area having an array of core flash memory cells fabricated therein and comprised of a periphery area having logic circuitry fabricated therein. A tunnel dielectric material is formed on the core area and the periphery area of the semiconductor substrate, and a first floating gate material is formed on the tunnel dielectric material of the core area and the periphery area of the semiconductor substrate. A first hardmask material is patterned to etch a first set of STI (shallow trench isolation) openings through the first floating gate material, the tunnel dielectric material, and the semiconductor substrate within the core area, and to etch a second set of STI (shallow trench isolation) openings through the first floating gate material, the tunnel dielectric material, and the semiconductor substrate within the periphery area. A core active device area of the semiconductor substrate within the core area is surrounded by the first set of STI openings, and a periphery active device area of the semiconductor substrate within the periphery area is surrounded by the second set of STI openings.

A dielectric liner is formed at sidewalls of the first and second sets of STI openings with reaction of the semiconductor substrate at the sidewalls of the STI openings such that corners of the semiconductor substrate of the core and periphery active device areas adjacent the STI openings are rounded. A trench dielectric material is deposited to fill the STI openings, and the first hardmask material is etched away. A second floating gate material is formed over any remaining portion of the first floating gate material and on the trench dielectric material within the core area and the periphery area. A second hardmask material is patterned to remain on the second floating gate material over the core active device area and over the whole periphery area. The second floating gate material exposed through the second hardmask material is etched away from the trench dielectric material within the core active device area.

The present invention may be used to particular advantage when the first floating gate material is comprised of an undoped semiconductor material such as undoped polysilicon such that the tunnel dielectric material adjacent the first floating gate material is not doped during formation of the dielectric liner at the sidewalls of the STI openings when the semiconductor substrate is heated to preserve the integrity of the tunnel dielectric material. In that case, the second floating gate material is comprised of doped semiconductor material such as doped polysilicon for enhanced conductivity of the floating gate and is deposited after formation of the dielectric liner of the STI openings to preserve the integrity of the tunnel dielectric material.

In a further embodiment of the present invention, spacers are formed on sidewalls of the second hardmask material disposed over the core active device area before the second floating gate material is etched such that the spacers are disposed over portions of the trench dielectric material adjacent the core active device area. In that case, the second floating gate material remains disposed over portions of the trench dielectric material adjacent the core active device area from being covered by the spacers of the second hardmask material.

In another embodiment of the present invention, the second hardmask material is etched away from the core area and the periphery area, and a floating gate dielectric material is formed on any exposed surfaces of the second floating gate material and the trench dielectric material within the core area and the periphery area. A masking material is patterned to remain on the floating gate dielectric material within the core area while exposing the floating gate dielectric material on the first and second floating gate materials within the periphery area. The floating gate dielectric material and the first and second floating gate materials within the periphery area are etched away to expose the semiconductor substrate of the periphery active device area and to expose the trench dielectric material filling the second set of STI openings within the periphery area. A dip-off etch of the trench dielectric material filling the second set of STI openings within the periphery area is performed to expose corners of the semiconductor substrate of the periphery active device area adjacent the second set of STI openings. A dummy dielectric is formed with the semiconductor substrate of the periphery active device area including the exposed corners of the periphery active device area adjacent the second set of STI openings. The dummy dielectric is etched from the semiconductor substrate for further rounding the exposed corners of the periphery active device area.

In this manner, the top corners of the core and periphery active device areas adjacent the STI structures are rounded for minimizing leakage current through a flash memory cell formed in the core active device area and through a MOSFET formed in the periphery active device area. In addition, the present invention may be used to particular advantage when the first floating gate material is comprised of an undoped semiconductor material such as undoped polysilicon such that the tunnel dielectric material adjacent the first floating gate material is not doped during formation of the dielectric liner at the sidewalls of the STI openings when the semiconductor substrate is heated to preserve the integrity of the tunnel dielectric material. In that case, the second floating gate material is comprised of doped semiconductor material such as doped polysilicon for enhanced conductivity of the floating gate and is deposited after formation of the dielectric liner of the STI openings to preserve the integrity of the tunnel dielectric material.

These and other features and advantages of the present invention will be better understood by considering the following detailed description of the invention which is presented with the attached drawings.

BRIEF DESCRIPTION OF THE DRAWINGS

FIGS. 5, 6, 7, 8, 9, 10, 11, 12, 13, 14, 15, 16, 17, 18, 19, 20, 21, 22, 23, 24, 25, 26, 27, 28, 29, 30, 31, and 32 show cross-sectional views for forming STI structures surrounding a core active device area having a flash memory cell fabricated therein and surrounding a periphery active device area having a MOSFET fabricated therein with rounding of the top corners of the core and periphery active device areas to minimize leakage current, according to an aspect of the present invention.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, and 32 refer to elements having similar structure and function.

DETAILED DESCRIPTION

Figure 5:
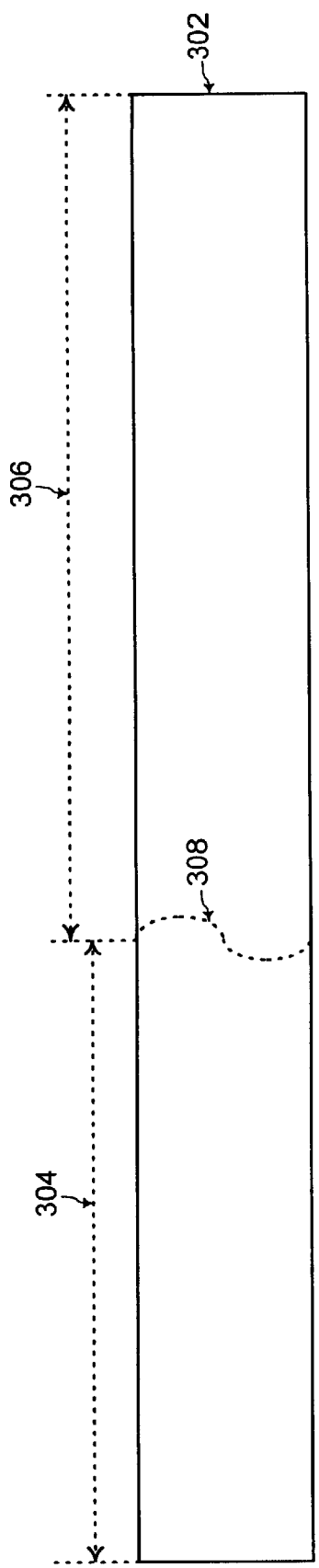

In the cross-sectional view of FIG. 5, a semiconductor substrate 302 forms a semiconductor die having a flash memory device fabricated therein. The semiconductor substrate 302 is comprised of silicon according to one embodiment of the present invention. Similar to FIG. 2, an array of flash memory cells is fabricated within a core area 304, and a logic circuitry is fabricated within a periphery area 306. A dashed line 308 represents the separation of the core area 304 and the periphery area 306 in FIG. 5.

The present invention is described with illustration of fabrication of one flash memory cell within one core active device area in the core area 304 and of one MOSFET (Metal Oxide Semiconductor Field Effect Transistor) within one periphery active device area in the periphery area 306, for clarity of illustration. However, the present invention may be used for fabricating more numerous flash memory cells within more numerous core active device areas of the core area 304 and for fabricating more numerous MOSFETs within more numerous periphery active device areas of the periphery area 306, as would be apparent to one of ordinary skill in the art of flash memory device fabrication from the description herein.

Figure 1:
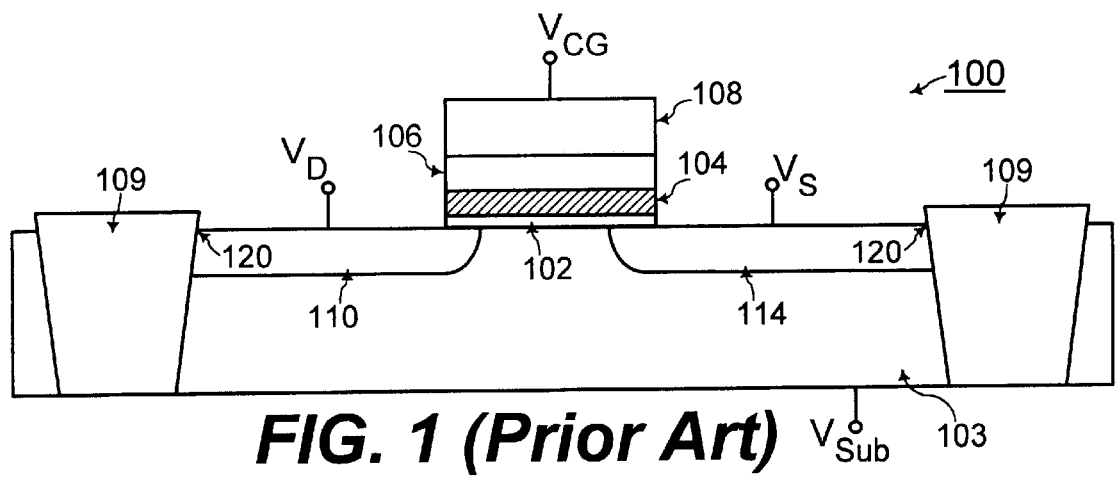
FIG. 1 shows a cross-sectional view of a conventional flash memory cell of a flash memory device, without rounding of the top corners of a core active device area having the flash memory fabricated therein, according to the prior art.
Figure 2:
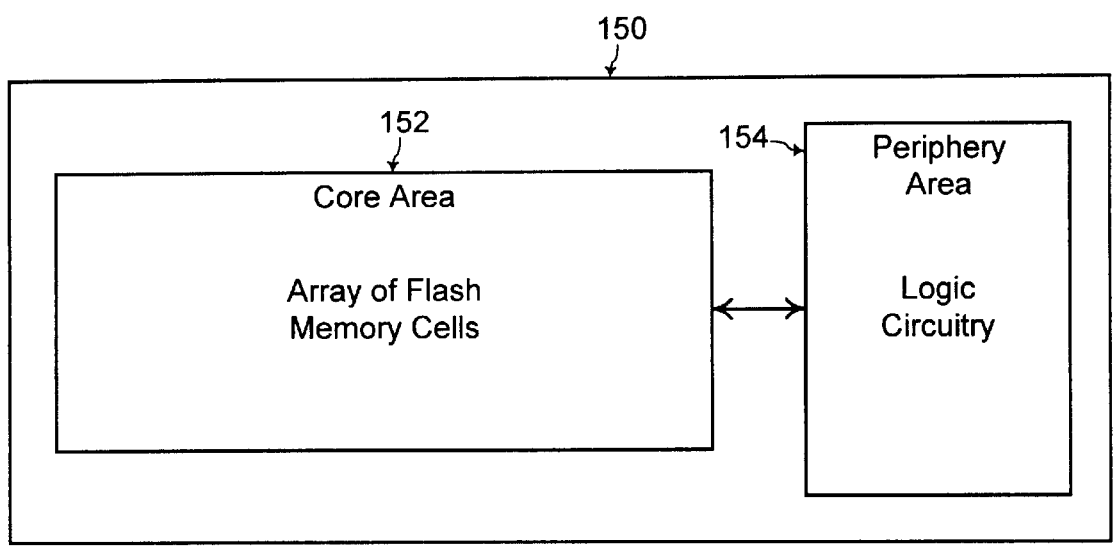
FIG. 2 shows a top view of a semiconductor die having a core area with an array of flash memory cells fabricated therein and having a periphery area with logic circuitry fabricated therein, according to the prior art.
Figure 3:
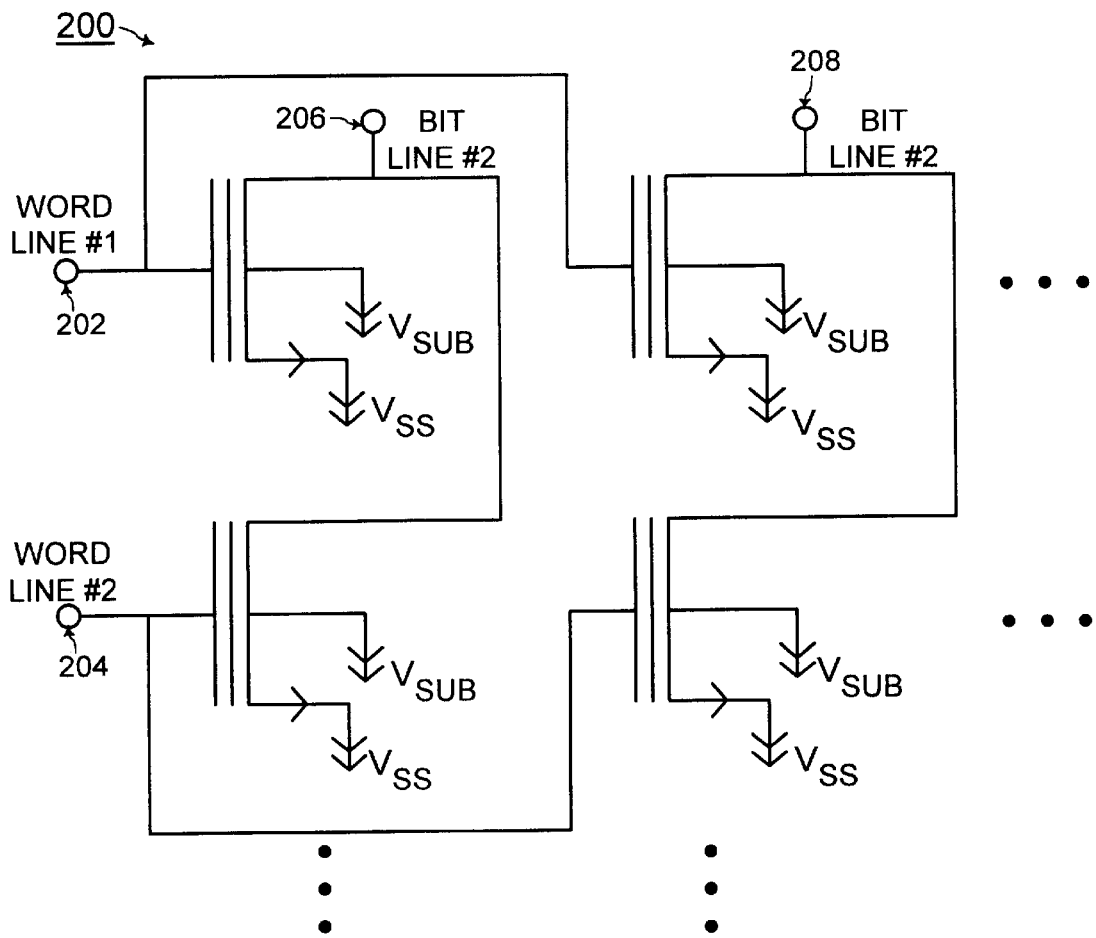
FIG. 3 shows a circuit diagram of the array of flash memory cells fabricated within the core area of FIG. 2, according to the prior art.
Figure 6:
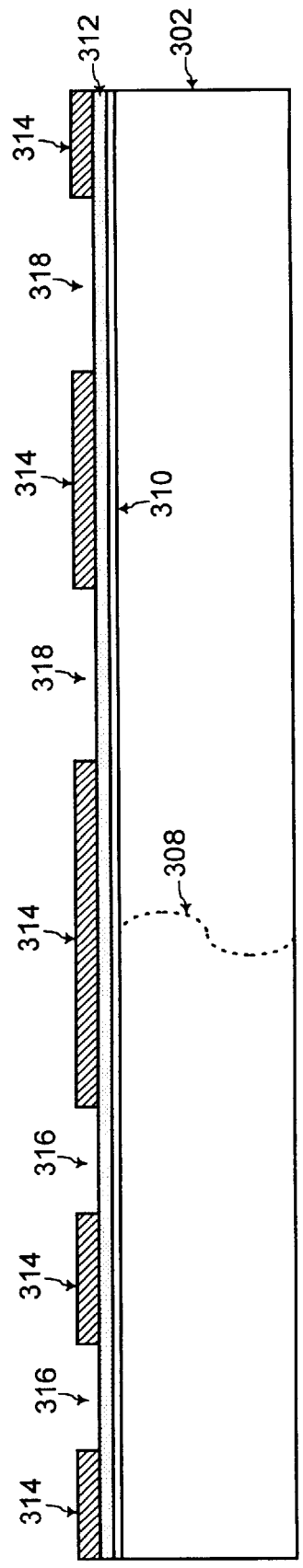

Referring to FIGS. 5 and 6, a tunnel dielectric material 310 is deposited on the core area 304 and on the periphery area 306. Referring to FIGS. 1 and 6, the tunnel dielectric material 310 is deposited to form the tunnel dielectric 102 of a flash memory cell within the core area 304, and the tunnel dielectric material 304 is comprised of silicon dioxide ($SiO_2$) having a thickness of about 100 angstroms according to one embodiment of the present invention. In addition, referring to FIG. 6, a first floating gate material 312 is deposited on the tunnel dielectric material 310. Referring to FIGS. 1 and 6, the first floating gate material 312 is deposited to form the floating gate 104 of the flash memory cell within the core area 304, and the first floating gate material 312 is comprised of undoped polysilicon having a thickness of about 500 angstroms to about 1000 angstroms according to one embodiment of the present invention. Processes for depositing such a tunnel dielectric material 310 and such a first floating gate material 312 are known to one of ordinary skill in the art of integrated circuit fabrication.

Further referring to FIG. 6, a first hardmask material 314 is patterned to form a first set of STI (shallow trench isolation) openings 316 within the core area 304 and a second set of STI (shallow trench isolation) openings 318 within the periphery area 306. The first hardmask material 314 is comprised of silicon nitride ($Si_3N_4$) having a thickness in a range of from about 1000 angstroms to about 1500 angstroms according to one embodiment of the present invention. Processes for depositing and patterning such a first hardmask material 314 are known to one of ordinary skill in the art of integrated circuit fabrication.

Referring to FIG. 7, the portions of the first floating gate material 312, the tunnel dielectric material 310, and the semiconductor substrate 302 exposed through the first and second STI openings 316 and 318 are etched away such that the first and second STI openings 316 and 318 are surrounded by the semiconductor substrate 302. The first set of STI openings 316 surround a portion of the semiconductor substrate 302 in the core area 304 to define a core active device area 320. Similarly, the second set of STI openings 318 surround a portion of the semiconductor substrate 302 in the periphery area 306 to define a periphery active device area 322. Processes for etching away the portions of the first floating gate material 312, the tunnel dielectric material 310, and the semiconductor substrate 302 exposed through the first and second STI openings 316 and 318 are known to one of ordinary skill in the art of integrated circuit fabrication.

Referring to FIG. 8, dielectric liners 324 are formed at exposed walls such as the bottom walls and the sidewalls of the first and second STI openings 316 and 318. In one embodiment of the present invention, the dielectric liners 324 are comprised of silicon dioxide ($SiO_2$) formed from thermal oxidation of the semiconductor substrate 302 at the bottom walls and the sidewalls of the first and second set of STI openings 316 and 318. Thermal oxidation processes for formation of such dielectric liners 324 are known to one of ordinary skill in the art of integrated circuit fabrication.

Figure 4:
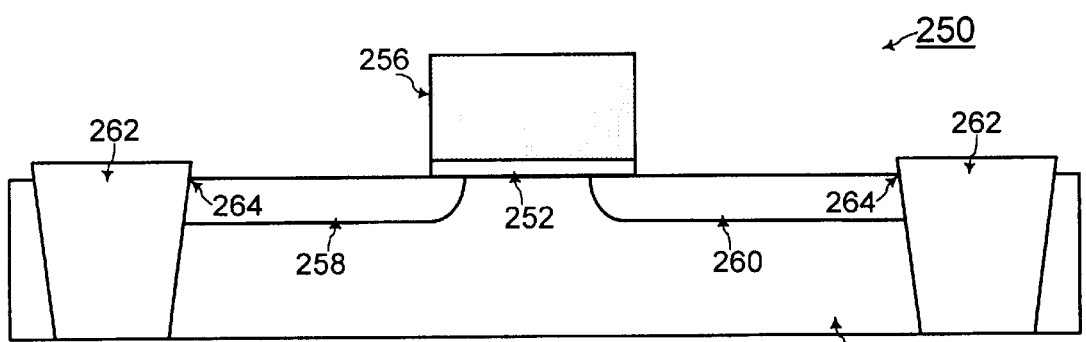
FIG. 4 shows a cross-sectional view of a conventional MOSFET (Metal Oxide Semiconductor Field Effect Transistor) for forming the logic circuitry in the periphery area of FIG. 2, without rounding of the top corners of a periphery active device area having the MOSFET fabricated therein, according to the prior art.

Further referring to FIG. 8, a trench dielectric material 326 is deposited to fill the first and second set of STI openings 316 and 318. In one embodiment of the present invention, the trench dielectric material 326 is comprised of silicon dioxide ($SiO_2$) deposited with an HDP (high density plasma) deposition process. Such processes for depositing the trench dielectric material 326 to fill the first and second set of STI openings 316 and 318 are known to one of ordinary skill in the art of integrated circuit fabrication. Referring to FIGS. 1, 4, and 8, the trench dielectric material 326 is deposited to form the STI structures 109 for the flash memory cell in the core area 304 and the STI structures 262 in the periphery area 306.

Figure 9:
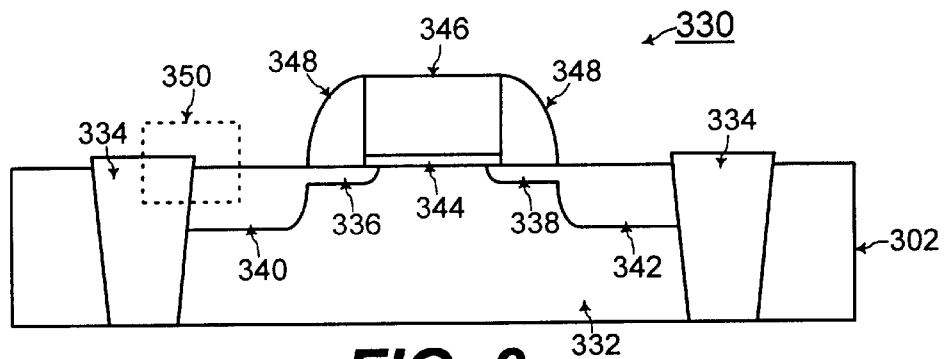

Referring to FIG. 9, an example MOSFET 330 is formed in an active device area 332 of the semiconductor substrate 302 surrounded by STI structures 334. The MOSFET 330 includes a drain extension junction 336, a source extension junction 338, a drain contact junction 340, and a source contact junction 342. In addition, the MOSFET 330 includes a gate dielectric 344 and a gate structure 346 on the gate dielectric 344. Spacers 348 are disposed on the drain and source extension junctions 336 and 338 at the sidewalls of the gate structure 346. Such structures of the MOSFET 330 are known to one of ordinary skill in the art of integrated circuit fabrication.

Figure 10:
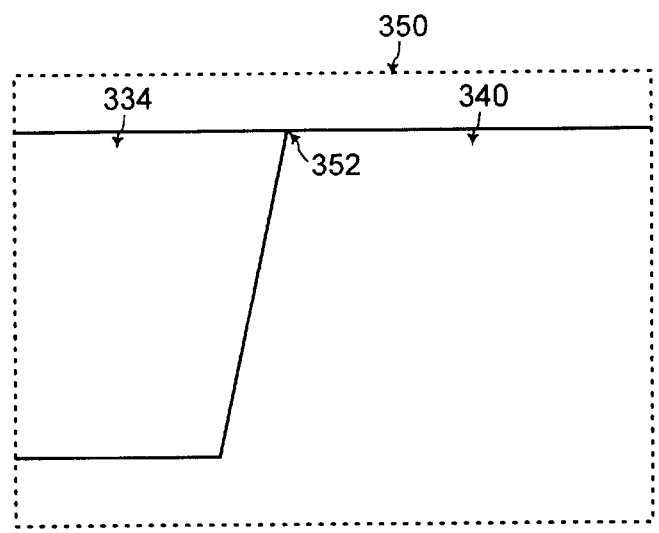
Figure 11:
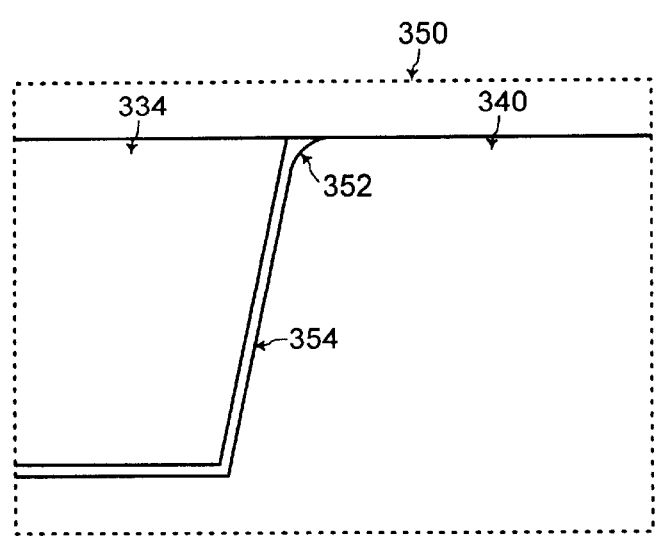

Referring to FIGS. 9 and 10, an enlarged view of a top corner 352 of the active device area 332 adjacent the spacer 334 is illustrated in FIG. 10. FIG. 10 is an enlarged view of the cross-sectional area within the dashed lines 350 in FIG. 9. The top corner 352 of the active device area 332 adjacent the spacer 334 is a relatively sharp corner without any rounding in FIG. 9. The top corner 352 of the active device area 332 adjacent the spacer 334 forms part of the drain or the source of the MOSFET 330, and when the top corner 352 is relatively sharp, a higher undesired leakage current flows through the drain or source of the MOSFET 330. Referring to FIG. 11, a dielectric liner 354 that is similar to the dielectric liners 324 of FIG. 8 is formed at the bottom wall and the sidewalls of the spacer 334 in a thermal oxidation process using the semiconductor substrate 302 at the bottom wall and the sidewalls of the spacer 334.

For example, when the semiconductor substrate 302 is comprised of silicon, the dielectric liner 354 is comprised of silicon dioxide ($SiO_2$) formed in a thermal oxidation process according to one embodiment of the present invention. With formation of such a dielectric liner 354, the top corner 352 of the active device area 332 adjacent the spacer 334 is rounded to decrease the undesired leakage current flowing through the drain or source of the MOSFET 330. Processes for forming such a dielectric liner 354 in a thermal oxidation process are known to one of ordinary skill in the art of integrated circuit fabrication.

Referring to FIGS. 8 and 12, after deposition of the trench dielectric material 326, a thermal densification process is performed according to one embodiment of the present invention to densify the trench dielectric material 326. Thermal densification processes are known to one of ordinary skill in the art of integrated circuit fabrication. In addition, an etch-back process is performed for leveling down the peaks of the trench dielectric material 326 according to one embodiment of the present invention before polishing down the trench dielectric material 326. Such etch-back processes are known to one of ordinary skill in the art of integrated circuit fabrication. The present invention may be practiced with or without such a thermal densification process or such an etch-back process.

Referring to FIGS. 12 and 13, the trench dielectric material 326 is polished down until the first hardmask material 314 is exposed such that the trench dielectric material 326 is contained within the first set of STI openings 316 to form the first set of STI structures 360 and within the second set of STI openings 318 to form the second set of STI structures 362. Processes such as CMP (chemical mechanical polishing) processes for polishing down the trench dielectric material 326 are known to one of ordinary skill in the art of integrated circuit fabrication.

Referring to FIG. 13, after formation of the first and second set of STI structures 360 and 362, an additional liner oxidation process is performed to increase the thickness of the dielectric liners 324, according to one embodiment of the present invention. After the first liner oxidation process in FIG. 11 for initially forming the dielectric liners 324 before deposition of the trench dielectric material 326, the dielectric liners 324 are formed to have a relatively small thickness of from about 50 angstroms to about 100 angstroms such that the first floating gate material 312 exposed at the sidewalls of the STI openings 316 and 318 is not significantly oxidized.

Referring to FIG. 13, the additional liner oxidation process is performed after formation of the first and second set of STI structures 360 and 362 that cover the first floating gate material 312 to minimize oxidation of the first floating gate material 312 while increasing the thickness of the dielectric liners 324 from oxidation of the semiconductor substrate 302. Referring to FIGS. 11 and 13, by increasing the thickness of the dielectric liners 324, the top corners 352 of the core active device area 320 and the periphery active device area 322 are further rounded. Liner oxidation processes are known to one of ordinary skill in the art of integrated circuit fabrication.

Referring to FIGS. 13 and 14, the first hardmask material 314 is etched away to expose the first floating gate material 312. Selective etching processes for etching away the first hardmask material 314 comprised of silicon nitride ($Si_3N_4$) for example are known to one of ordinary skill in the art of integrated circuit fabrication. Referring to FIGS. 14 and 15, a second floating gate material 364 is deposited on any exposed surfaces including on the first and second set of STI structures 360 and 362 and on the first floating gate material 312 over the core active device area 320 and the periphery active device area 322.

Referring to FIGS. 1 and 15, the first and second floating gate materials 312 and 364 are deposited to form the floating gate 104 of a flash memory cell to be fabricated on the core active device area 320 surrounded by the first set of STI structures 360. In one embodiment of the present invention, the first floating gate material 312 is comprised of an undoped semiconductor material such as undoped polysilicon having a thickness of from about 500 angstroms to about 1000 angstroms for example. The second floating gate material 364 is comprised of a doped semiconductor material such as polysilicon doped with arsenic or phosphorous having a thickness of from about 500 angstroms to about 1000 angstroms for example.

Referring to FIGS. 6 and 8, the first floating gate material 312 is deposited onto the tunnel dielectric material 310 before formation of the dielectric liners 324. The thermal oxidation process for formation of the dielectric liners 324 heats up the semiconductor substrate 302. When the first floating gate material 312 is comprised of undoped polysilicon, a dopant does not diffuse into the tunnel dielectric material 310 from the first floating gate material 312 when the semiconductor substrate 302 is heated up during the thermal oxidation process for formation of the dielectric liners 324. Thus, the integrity of the tunnel dielectric material 310 is preserved.

In addition, when the first floating gate material 312 is comprised of undoped polysilicon, the first floating gate material 312 is consumed less to form part of the dielectric liners 324 than if the first floating gate material 312 were comprised of doped polysilicon such that the first floating gate material 312 is conserved for forming the floating gate of the flash memory cell. On the other hand, referring to FIG. 15, the second floating gate material 364 comprised of doped polysilicon is deposited after the thermal oxidation process for forming the dielectric liners 324 to enhance the conductivity of the floating gate of the flash memory cell.

Figure 16:
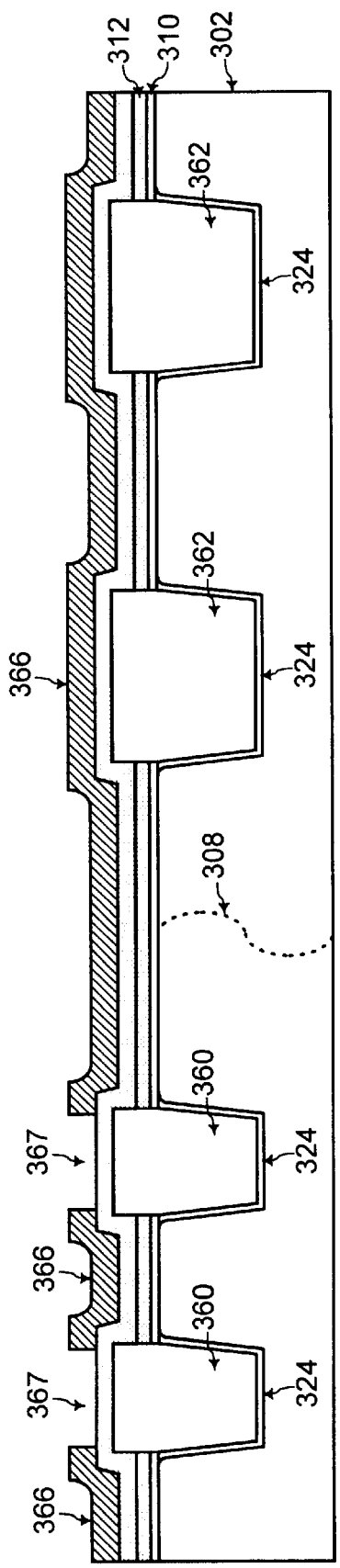

Referring to FIG. 16, a second hardmask material 366 is deposited and patterned to form device separation openings 367 over the first set of STI structures 360. The second hardmask material 366 is comprised of silicon nitride ($Si_3N_4$) having a thickness of from about 500 angstroms to about 1200 angstroms according to one embodiment of the present invention. The second hardmask material 366 covers the periphery area 306. Processes for depositing and patterning such a second hardmask material 366 are known to one of ordinary skill in the art of integrated circuit fabrication.

Figure 17:
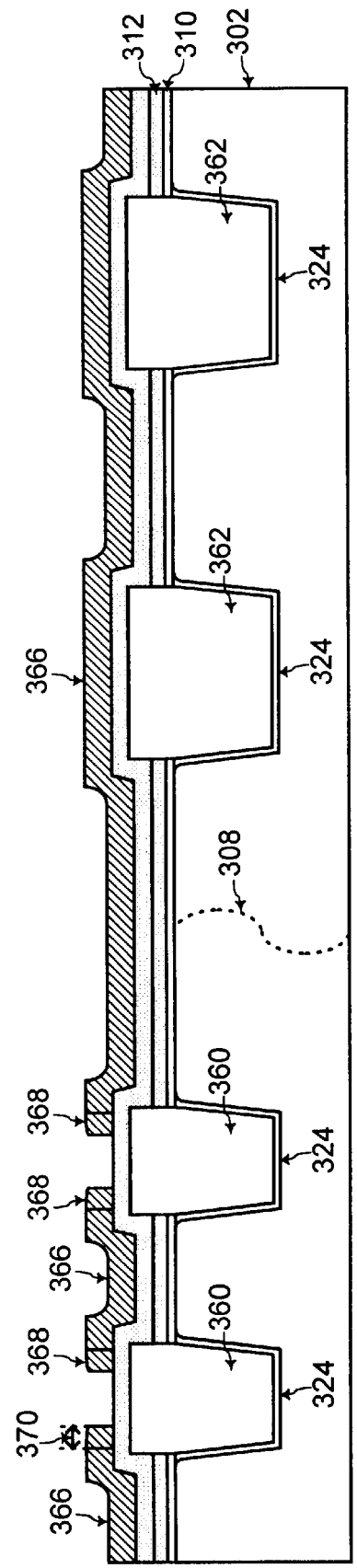

Referring to FIG. 17, hardmask spacers 368 are formed at the sidewalls of the device separation openings 367. The hardmask spacers 368 are comprised of silicon nitride ($Si_3N_4$) and have a width 370 of about 500 angstroms. The hardmask spacers 368 cover the portions of the second floating gate material 364 disposed on the first set of STI structures 360 toward the sidewalls of the first set of STI structures 360. The hardmask spacers 368 reduce the width of the device separation openings 367 by about 1000 angstroms such that smaller dimensions of the device separation openings 367 are achieved than the dimensions that are possible with photolithography technology. Such smaller dimensions of the device separation openings 367 advantageously results in a more compact array of flash memory cells formed in the core area 304. Processes for forming such hardmask spacers 368 are known to one of ordinary skill in the art of integrated circuit fabrication.

Referring to FIG. 18, the second floating gate material 364 exposed through the device separation openings 367 is etched away to expose the first set of STI structures 360 through the device separation openings 367. Processes for etching away the second floating gate material 364 comprised of doped polysilicon for example and exposed through the device separation openings 367 are known to one of ordinary skill in the art of integrated circuit fabrication. With the hardmask spacers 368, the second floating gate material 364 remains over portions of the first set of STI structures 360 toward the sidewalls of the first set of STI structures 360.

Referring to FIG. 19, the second hardmask material 366 is etched away. Processes for selectively etching away the second hardmask material 366 comprised of silicon nitride ($Si_3N_4$) for example are known to one of ordinary skill in the art of integrated circuit fabrication. Further referring to FIG. 19, a floating gate dielectric material 372 is deposited on any exposed surfaces of the first set of STI structures 360 and of the second floating gate material 364. In one embodiment of the present invention, the floating gate dielectric material 372 is comprised of ONO (a sandwich of oxide-nitride-oxide as known to one of ordinary skill in the art of integrated circuit fabrication). Processes for deposition of such a floating gate dielectric material 372 are known to one of ordinary skill in the art of integrated circuit fabrication.

Referring to FIG. 20, a masking material 374 is deposited and patterned to cover the core area 304 while exposing the periphery area 306. The masking material 374 is comprised of photoresist material according to one embodiment of the present invention. Processes for depositing and patterning such a masking material 374 are known to one of ordinary skill in the art of integrated circuit fabrication. In addition referring to FIG. 21, the portions of the floating dielectric material 372, the second floating gate material 364, the first floating gate material 312, and the tunnel dielectric material 310 disposed over the periphery area 306 are etched away to expose the second set of STI structures 362 and the semiconductor substrate 302 of the periphery area 306. The portions of the floating dielectric material 372, the second floating gate material 364, the first floating gate material 312, and the tunnel dielectric material 310 disposed over the core area 304 remain covered with the masking material 374 and are not etched away. Processes for etching away the portions of the floating dielectric material 372, the second floating gate material 364, the first floating gate material 312, and the tunnel dielectric material 310 over the periphery area 306 not covered by the masking material 374 are known to one of ordinary skill in the art of integrated circuit fabrication.

Figure 22:
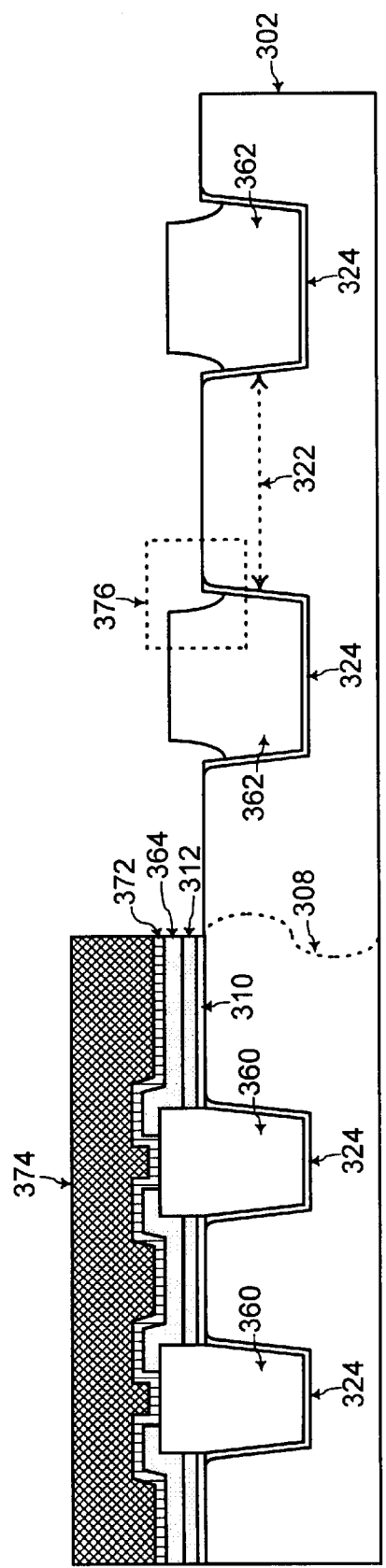

Referring to FIG. 22, a portion of the exposed sidewalls of the second set of STI structures 362 is etched away in a dip-off etch process to expose the top corners of the periphery active device area 322. In addition, referring to FIG. 23, the top corners of the periphery active device area 322 are further rounded by performing a thermal oxidation and etch-off of the semiconductor substrate 302 of the periphery active device area 322.

Figure 24:
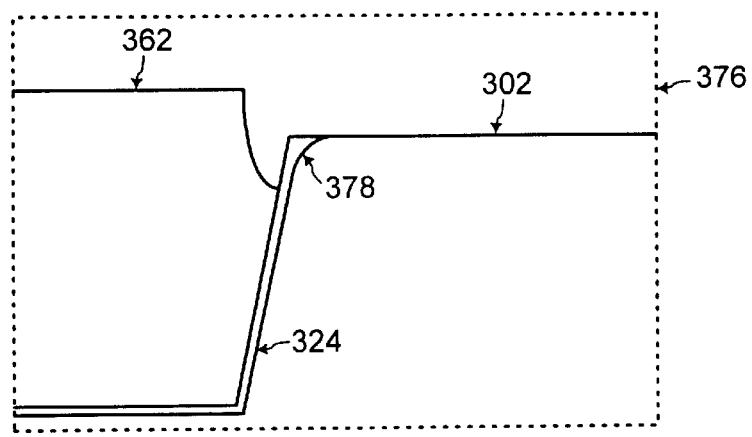

Referring to FIGS. 22 and 24, FIG. 24 shows an enlarged view of the top corner of the periphery active device area 322 adjacent the STI structure 362 (i.e., within the dashed lines 376 in FIG. 22). Referring to FIG. 24, portions of the exposed sidewalls of the STI structure 362 are etched away to expose the top corner 378 of the periphery active device area 322. In one embodiment of the present invention, approximately 300 angstroms to about 400 angstroms of the STI structures 362 are etched away in a dip-off etch process. Processes such as dip-off etch processes for etching away portions of the exposed sidewalls of the STI structures 362 are known to one of ordinary skill in the art of integrated circuit fabrication.

Figure 23:
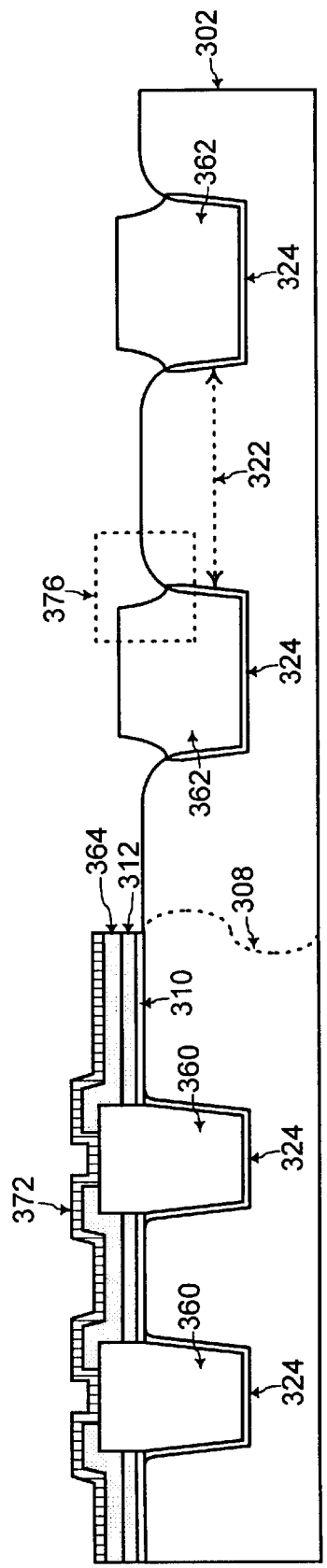
Figure 25:
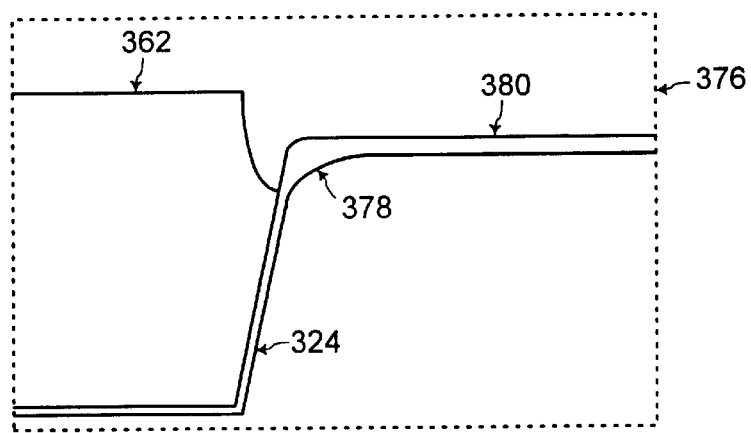

Referring to FIGS. 23 and 25, the masking material 374 is etched away. Processes for etching away the masking material 374 comprised of photoresist material for example are known to one of ordinary skill in the art of integrated circuit fabrication. Referring to FIG. 25, a thermal oxidation process is performed to form a dummy dielectric material 380 on any exposed surface of the periphery active device area 322. The dummy dielectric material 380 is comprised of silicon dioxide ($SiO_2$) having a thickness of about 300 angstroms formed from oxidation of the semiconductor substrate 302 of the periphery active device area 322.

Figure 26:
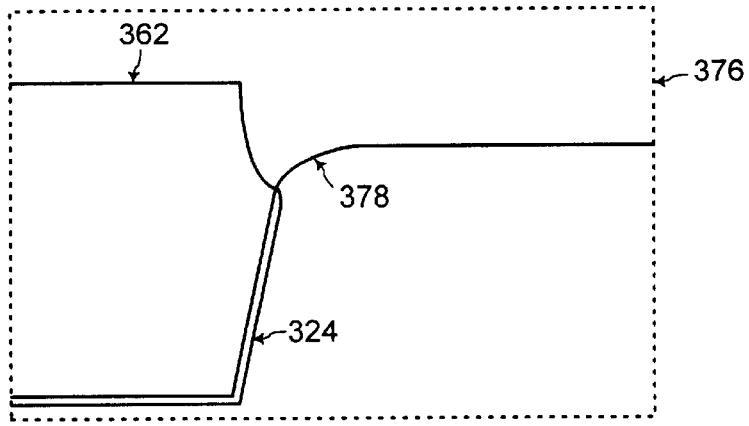

Formation of such a dummy dielectric material 380 further rounds the top corners 378 of the periphery active device area 322 adjacent the second set of STI structures 362. Referring to FIG. 23, the floating gate dielectric material 372 comprised of ONO (i.e., a sandwich of oxide-nitride-oxide) on the core area 304 prevents formation of any silicon dioxide ($SiO_2$) in the core area 304 during the thermal oxidation process for forming the dummy dielectric material 380 in the periphery area 306. Thermal oxidation processes for forming such a dummy dielectric material 380 are known to one of ordinary skill in the art of integrated circuit fabrication. Referring to FIG. 26, the dummy dielectric material 380 is etched away to expose the periphery active device area 322. Processes for etching away the dummy dielectric material 380 comprised of silicon dioxide ($SiO_2$) for example are known to one of ordinary skill in the art of integrated circuit fabrication.

Figure 27:
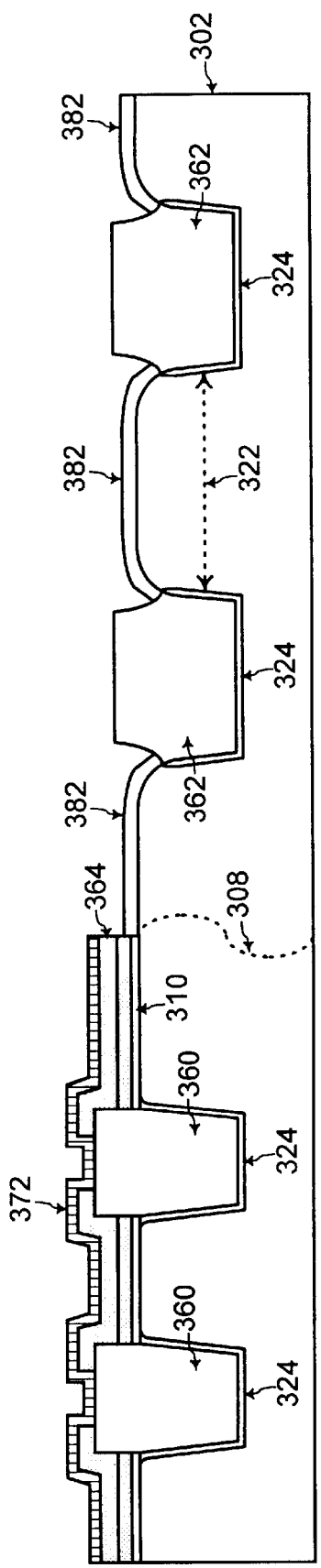

Referring to FIG. 27, after the top corners of the periphery active device area 322 are further rounded as illustrated in FIGS. 24, 25, and 26, a gate dielectric material 382 is formed on any exposed surfaces of the semiconductor substrate 302 including the periphery active device area 322. The gate dielectric material 382 is for forming a gate dielectric of a MOSFET to be fabricated on the periphery active device area 322. For example, when the MOSFET to be fabricated on the periphery active device area 322 is a high voltage MOSFET, the gate dielectric material 382 is comprised of silicon dioxide ($SiO_2$) having a relatively high thickness, as known to one of ordinary skill in the art of integrated circuit fabrication. Referring to FIG. 27, the floating gate dielectric material 372 comprised of ONO (i.e., a sandwich of oxide-nitride-oxide) on the core area 304 prevents formation of any silicon dioxide ($SiO_2$) in the core area 304 during the thermal oxidation process for forming the gate dielectric material 382 in the periphery area 306.

Figure 28:
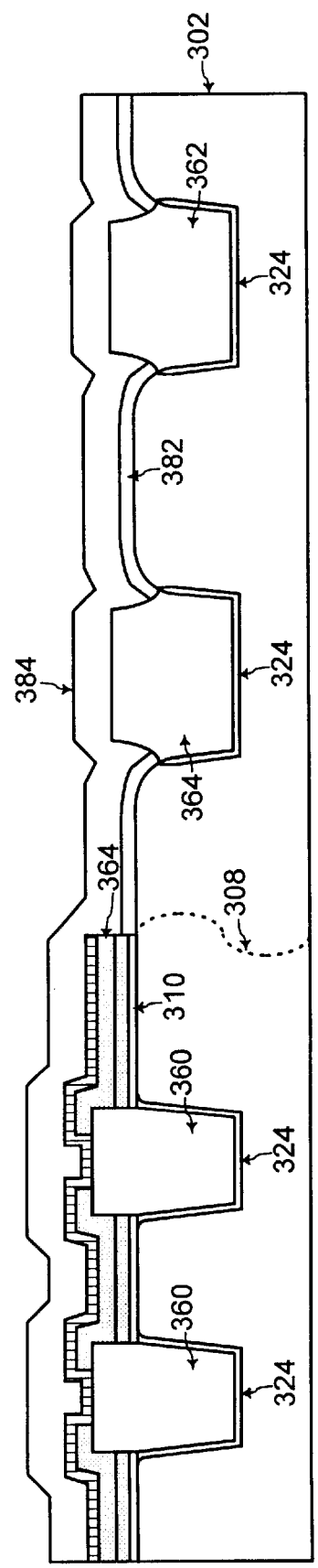

Referring to FIG. 28, a control gate material 384 is then deposited on any exposed surfaces including on the floating gate dielectric material 372 on the core area 304 and on the gate dielectric material 382 on the periphery area 306. The control gate material 384 is comprised of doped polysilicon according to one embodiment of the present invention. Processes for deposition of such control gate material 384 are known to one of ordinary skill in the art of integrated circuit fabrication.

Figure 29:
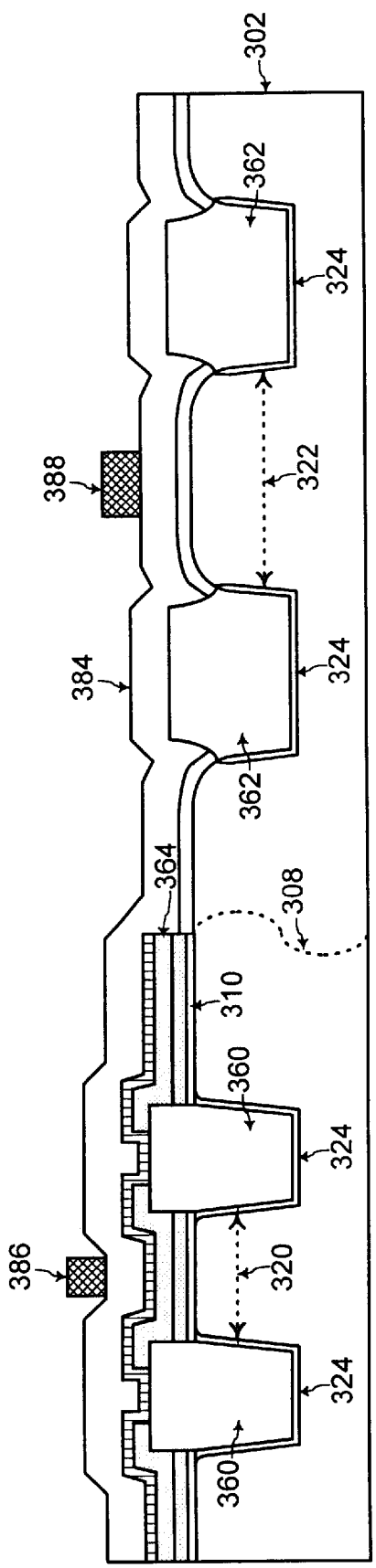

Referring to FIG. 29, a flash memory gate mask 386 is formed over the core active device area 320, and a MOSFET gate mask 388 is formed over the periphery active device area 322. The flash memory gate mask 386 and the MOSFET gate mask 388 are comprised of photoresist material according to one embodiment of the present invention. Processes for deposition and patterning photoresist material for formation of the flash memory gate mask 386 and the MOSFET gate mask 388 are known to one of ordinary skill in the art of integrated circuit fabrication.

Figure 30:
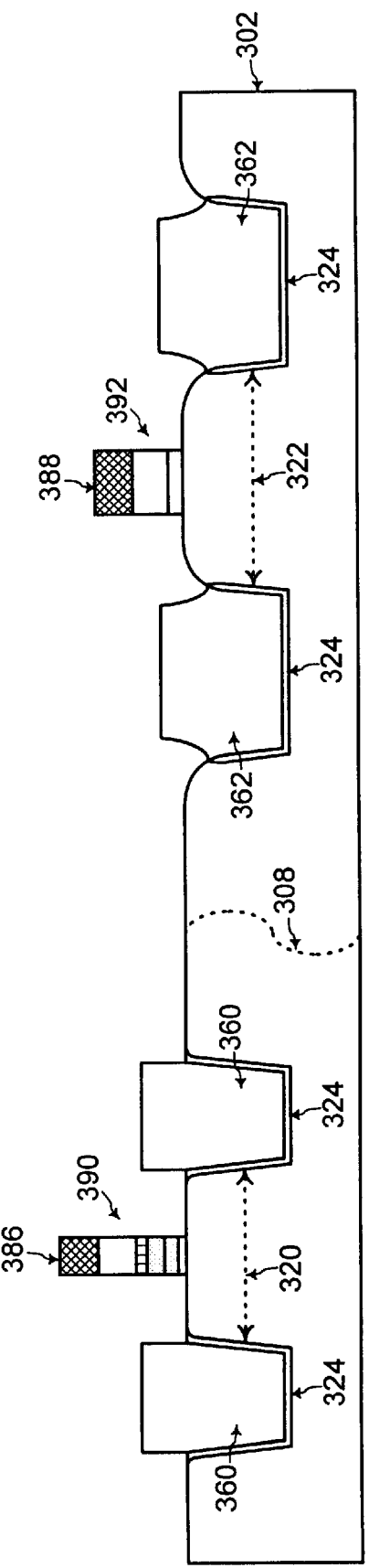

Referring to FIG. 30, any portions of the control gate material 384, the gate dielectric material 382, the floating dielectric material 372, the first and second floating gate materials 312 and 364, and the tunnel dielectric material 310 not covered under the flash memory gate mask 386 and the MOSFET gate mask 388 are etched away. The portion of the control gate material 384, the floating dielectric material 372, the first and second floating gate materials 312 and 364, and the tunnel dielectric material 310 remaining under the flash memory gate mask 386 forms a flash memory cell gate stack 390 for a flash memory cell to be fabricated within the core active device area 320. Similarly, the portion of the control gate material 384 and the gate dielectric material 382 remaining under the MOSFET gate mask 388 forms a MOSFET gate stack 392 for a MOSFET to be fabricated within the periphery active device area 322.

Referring to FIGS. 1 and 30, the tunnel dielectric material 310 remaining under the flash memory gate mask 386 forms the tunnel dielectric 102 of the flash memory cell to be fabricated within the core active device area 320. The first and second floating gate materials 312 and 364 remaining under the flash memory gate mask 386 forms the floating gate 104 of the flash memory cell to be fabricated within the core active device area 320. The floating gate dielectric material 372 remaining under the flash memory gate mask 386 forms the floating gate dielectric 106 of the flash memory cell to be fabricated within the core active device area 320. The control gate material 384 remaining under the flash memory gate mask 386 forms the control gate 108 of the flash memory cell to be fabricated within the core active device area 320.

Referring to FIGS. 4 and 30, the gate dielectric material 382 remaining under the MOSFET gate mask 388 forms the gate dielectric 252 for the MOSFET to be fabricated within the periphery active device area 322. The control gate material 384 remaining under the MOSFET gate mask 388 forms the gate structure 256 for the MOSFET to be fabricated within the periphery active device area 322. Processes for etching away the portions of the control gate material 384, the gate dielectric material 382, the floating gate dielectric material 372, the first and second floating gate material 312 and 364, and the tunnel dielectric material 310 not covered under the flash memory gate mask 386 and the MOSFET gate mask 388 are known to one of ordinary skill in the art of integrated circuit fabrication.

Figure 31:
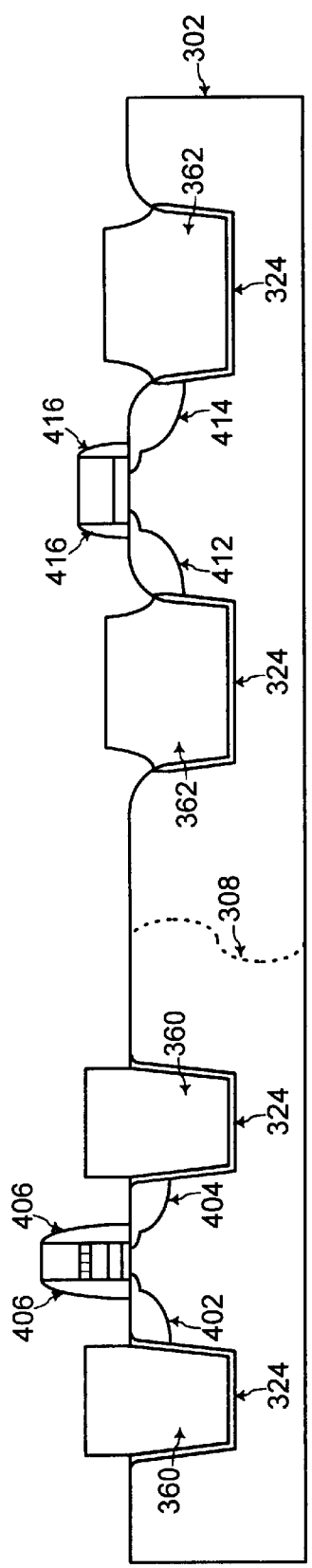

Referring to FIGS. 30 and 31, after formation of the flash memory cell gate stack 390 and the MOSFET gate stack 392, a dopant is implanted into the exposed portions of the core active device area 320 to form a drain bit line junction 402 and a source bit line junction 404 of the flash memory cell fabricated within the core active device area 320. In addition, gate stack spacers 406 are formed at the sidewalls of the flash memory cell gate stack 390. Furthermore, the dopant is implanted into the exposed portions of the periphery active device area 322 to form a drain junction 412 and a source junction 414 of the MOSFET fabricated within the periphery active device area 322. Additionally, gate stack spacers 416 are formed at the sidewalls of the MOSFET gate stack 392.

Processes for implanting a dopant, such as arsenic or phosphorous for example, to form the drain and source bit line junctions 402 and 404 for the flash memory cell fabricated within the core active device area 320 and to form the drain and source junctions 412 and 414 of the MOSFET fabricated within the periphery active device area 322 are known to one of ordinary skill in the art of integrated circuit fabrication. In addition, processes for formation of the gate stack spacers 406 and 416 which are comprised of silicon dioxide ($SiO_2$) according to one embodiment of the present invention are known to one of ordinary skill in the art of integrated circuit fabrication.

Figure 32:
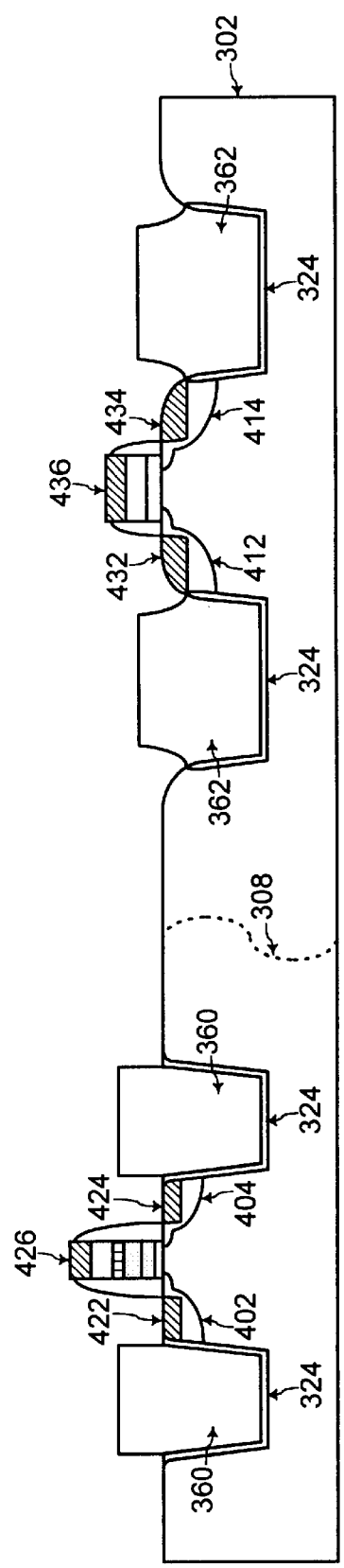

Referring to FIG. 32, a drain bit line silicide 422 is formed with the drain bit line junction 402 and a source bit line silicide 424 is formed with the source bit line junction 404 to provide contact to the drain and source bit line junctions 402 and 404 of the flash memory cell in the core active device area 320. In addition, a control gate silicide 426 is formed with the control gate of the flash memory cell gate stack 390 to provide contact to the control gate of the flash memory cell. Furthermore, a drain silicide 432 is formed with the drain junction 412, and a source silicide 434 is formed with the source junction 414, to provide contact to the drain and source junctions 412 and 414 of the MOSFET in the periphery active device area 322. Additionally, a gate silicide 436 is formed with the gate structure of the MOSFET gate stack 392 to provide contact to the gate structure of the MOSFET in the periphery active device area 322. Processes for forming such silicides 422, 424, 426, 432, 434, and 436 are known to one of ordinary skill in the art of integrated circuit fabrication. In one embodiment of the present invention, the silicides 422, 424, 426, 432, 434, and 436 are formed simultaneously to minimize the number of processing steps.

In this manner, the top corners of the core and periphery active device areas 320 and 322 adjacent the STI structures 360 and 362 are rounded for minimizing leakage current through the flash memory cell formed in the core active device area 320 and through the MOSFET formed in the periphery active device area 322. In addition, the present invention may be used to particular advantage when the first floating gate material 312 is comprised of an undoped semiconductor material such as undoped polysilicon such that the tunnel dielectric material 310 adjacent the first floating gate material 312 is not doped during formation of the dielectric liners 324 at the sidewalls of the STI openings 316 and 318 when the semiconductor substrate 302 is heated to preserve the integrity of the tunnel dielectric material 310. In that case, the second floating gate material 364 is comprised of doped semiconductor material such as doped polysilicon for enhanced conductivity of the floating gate and is deposited after formation of the dielectric liners 324 of the STI openings 316 and 318 to preserve the integrity of the tunnel dielectric material 310.

The foregoing is by way of example only and is not intended to be limiting. For example, the present invention is described with illustration of fabrication of one flash memory cell within one core active device area 320 in the core area 304 and of one MOSFET (Metal Oxide Semiconductor Field Effect Transistor) within one periphery active device area 322 in the periphery area 306, for clarity of illustration. However, the present invention may be used for fabricating more numerous flash memory cells within more numerous core active device areas of the core area 304 and for fabricating more numerous MOSFETs within more numerous periphery active device areas of the periphery area 306, as would be apparent to one of ordinary skill in the art of flash memory device fabrication from the description herein.

The present invention is limited only as defined in the following claims and equivalents thereof

We claim:

1. A method for forming STI (shallow trench isolation) structures of a flash memory device fabricated within an semiconductor substrate comprised of a core area having an array of core flash memory cells fabricated therein and comprised of a periphery area having logic circuitry fabricated therein, the method including the steps of:
   A. forming tunnel dielectric material on said core area and said periphery area of said semiconductor substrate;
   B. forming a first floating gate material on said tunnel dielectric material of said core area and said periphery area of said semiconductor substrate;
   C. patterning a first hardmask material to etch a first set of STI (shallow trench isolation) openings through said first floating gate material, said tunnel dielectric material, and said semiconductor substrate within said core area, and to etch a second set of STI (shallow trench isolation) openings through said first floating gate material, said tunnel dielectric material, and said semiconductor substrate within said periphery area;
   wherein a core active device area of said semiconductor substrate within said core area is surrounded by said first set of STI openings, and wherein a periphery active device area of said semiconductor substrate within said periphery area is surrounded by said second set of STI openings;
   D. forming a dielectric liner at sidewalls of said first and second sets of STI openings with reaction of said semiconductor substrate at said sidewalls of said STI openings such that corners of said semiconductor substrate of said core and periphery active device areas adjacent said STI openings are rounded;
   E. depositing a trench dielectric material to fill said STI openings;
   F. etching away said first hardmask material;
   G. forming a second floating gate material over any remaining portion of said first floating gate material and on said trench dielectric material within said core area and said periphery area;
   H. patterning a second hardmask material to remain on said second floating gate material over said core active device area and over said whole periphery area; and
   I. etching away said second floating gate material exposed through said second hardmask material on said trench dielectric material within said core active device area.

2. The method of claim 1, further including the steps of:
   J. forming spacers on sidewalls of said second hardmask material disposed over said core active device area such that said spacers are disposed over portions of said trench dielectric material adjacent said core active device area after said step H and before said step I;
   wherein said second floating gate material remains disposed over portions of said trench dielectric material adjacent said core active device area from being covered by said spacers of said second hardmask material after said step I.

3. The method of claim 2, further including the steps of:
   K. etching away said second hardmask material from said core area and said periphery area;
   L. forming a floating gate dielectric material on any exposed surfaces of said second floating gate material and said trench dielectric material within said core area and said periphery area;
   M. patterning a masking material to remain on said floating gate dielectric material within said core area while exposing said floating gate dielectric material on said first and second floating gate materials within said periphery area;
   N. etching away said floating gate dielectric material and said first and second floating gate materials within said periphery area to expose said semiconductor substrate of said periphery active device area and to expose said trench dielectric material filling said second set of STI openings within said periphery area;
   O. performing a dip-off etch of said trench dielectric material filling said second set of STI openings within said periphery area to expose corners of said semiconductor substrate of said periphery active device area adjacent said second set of STI openings; and
   P. forming a dummy dielectric with said semiconductor substrate of said periphery active device area including said exposed corners of said periphery active device area adjacent said second set of STI openings, and etching away said dummy dielectric from said semiconductor substrate for further rounding said exposed corners of said periphery active device area.

4. The method of claim 3, further including the steps of:

Q. etching away said masking material from said core area;

R. forming a gate dielectric material on said periphery active device area;

S. depositing a control gate material on said floating gate dielectric material within said core area and on said gate dielectric material within said periphery area; and T. patterning said tunnel dielectric material, said first and second floating gate materials, said floating gate dielectric material, and said control gate material within said core active device area to form a gate stack of a flash memory cell within said core area, and patterning said gate dielectric material and said control gate material within said periphery area to form a gate stack of a MOSFET (metal oxide semiconductor field effect transistor) within said periphery area.

5. The method of claim 4, further including the steps of:

U. implanting a dopant into exposed regions of said core active device area to form a drain bit line junction and a source bit line junction of said flash memory cell, and into exposed regions of said periphery active device area to form a drain junction and a source junction of said MOSFET; and V. forming silicide simultaneously with said control gate material of said gate stacks of said flash memory cell and of said MOSFET, and with said drain and source bit line junctions of said flash memory cell, and with said drain and source junctions of said MOSFET.

6. The method of claim 4, wherein said semiconductor substrate is comprised of silicon, and wherein said gate dielectric material formed in said step R is comprised of silicon dioxide ($SiO_2$), and wherein said control gate material deposited in said step S is comprised of polysilicon.

7. The method of claim 3, wherein said floating gate dielectric material formed in said step L is comprised of ONO (oxide-nitride-oxide).

8. The method of claim 3, wherein said semiconductor substrate is comprised of silicon, and wherein said trench dielectric material deposited in said step E is comprised of silicon dioxide ($SiO_2$), and wherein approximately 300 angstroms to about 400 angstroms of said trench dielectric material is etched away during said dip-off etch of said step O.

9. The method of claim 3, wherein said semiconductor substrate is comprised of silicon, and wherein said dummy dielectric formed in said step P is comprised of silicon dioxide ($SiO_2$) having a thickness of about 300 angstroms.

10. The method of claim 1, wherein said first floating gate material formed in said step B is comprised of undoped polysilicon, and wherein said second floating gate material formed in said step G is comprised of doped polysilicon.

11. The method of claim 1, further including the step of:

performing an additional liner oxidation process after said step E and before said step G for further rounding said corners of said semiconductor substrate of said core active device area and said periphery active device area.

12. The method of claim 1, wherein said semiconductor substrate is comprised of silicon, and wherein said tunnel dielectric material formed in said step A is comprised of silicon dioxide ($SiO_2$) having a thickness of about 100 angstroms.

13. The method of claim 1, wherein said first floating gate material formed in said step B is comprised of undoped polysilicon having a thickness in a range of from about 500 angstroms to about 1000 angstroms.

14. The method of claim 1, wherein said first hardmask material patterned in said step C is comprised of silicon nitride having a thickness in a range of from about 1000 angstroms to about 1500 angstroms.

15. The method of claim 1, wherein said dielectric liner formed at said sidewalls of said first and second sets of STI openings in said step D is comprised of silicon dioxide ($SiO_2$) having a thickness of about 50 angstroms to about 100 angstroms.

16. The method of claim 1, wherein said trench dielectric material deposited in said step E is comprised of silicon dioxide ($SiO_2$) that is also conformally deposited on said first hardmask material, and wherein the method further includes the steps of:

performing a reverse planarization process to etch away peaks of said trench dielectric material on said first hardmask material; and polishing down said trench dielectric material until said first hardmask material is exposed before said step F.

17. The method of claim 1, wherein said second floating gate material formed in said step G is comprised of doped polysilicon having a thickness in range of from about 500 angstroms to about 1000 angstroms.

18. The method of claim 1, wherein said second hardmask material patterned in said step H is comprised of silicon nitride having a thickness in a range of from about 500 angstroms to about 1200 angstroms.

19. The method of claim 18, wherein said spacers formed at sidewalls of second hardmask material in said step I are comprised of silicon nitride having a width of about 500 angstroms.

20. A method for forming STI (shallow trench isolation) structures of a flash memory device fabricated within an semiconductor substrate comprised of a core area having an array of core flash memory cells fabricated therein and comprised of a periphery area having logic circuitry fabricated therein, the method including the steps of:

A. forming tunnel dielectric material on said core area and said periphery area of said semiconductor substrate;

wherein said semiconductor substrate is comprised of silicon, and wherein said tunnel dielectric material is comprised of silicon dioxide ($SiO_2$) having a thickness of about 100 angstroms;

B. forming a first floating gate material comprised of undoped polysilicon on said tunnel dielectric material of said core area and said periphery area of said semiconductor substrate;

C. patterning a first hardmask material comprised of silicon nitride to etch a first set of STI (shallow trench isolation) openings through said first floating gate material, said tunnel dielectric material, and said semiconductor substrate within said core area, and to etch a second set of STI (shallow trench isolation) openings through said first floating gate material, said tunnel dielectric material, and said semiconductor substrate within said periphery area;

wherein a core active device area of said semiconductor substrate within said core area is surrounded by said first set of STI openings, and wherein a periphery active device area of said semiconductor substrate within said periphery area is surrounded by said second set of STI openings;

D. forming a dielectric liner comprised of silicon dioxide (SiO$_2$) at sidewalls of said first and second sets of STI openings with reaction of said semiconductor substrate at said sidewalls of said STI openings such that corners of said semiconductor substrate of said core and periphery active device areas adjacent said STI openings are rounded;

E. depositing a trench dielectric material comprised of silicon dioxide (SiO$_2$) to fill said STI openings;

wherein said trench dielectric material is also conformally deposited on said first hardmask material;

F. performing a reverse planarization process to etch away peaks of said trench dielectric material on said first hardmask material;

G. polishing down said trench dielectric material until said first hardmask material is exposed;

H. etching away said first hardmask material;

I. performing an additional liner oxidation process for further rounding said corners of said semiconductor substrate of said core active device area and said periphery active device area;

J. forming a second floating gate material comprised of doped polysilicon over any remaining portion of said first floating gate material and on said trench dielectric material within said core area and said periphery area;

K. patterning a second hardmask material comprised of silicon nitride to remain on said second floating gate material over said core active device area and over said whole periphery area;

L. forming spacers comprised of silicon nitride and having a width of about 500 angstroms on sidewalls of said second hardmask material disposed over said core active device area such that said spacers are disposed over portions of said trench dielectric material adjacent said core active device area;

M. etching away said second floating gate material exposed through said second hardmask material on said trench dielectric material within said core active device area;

wherein said second floating gate material remains disposed over portions of said trench dielectric material adjacent said core active device area from being covered by said spacers of said second hardmask material after said step M;

N. etching away said second hardmask material from said core area and said periphery area;

O. forming a floating gate dielectric material comprised of ONO (oxide-nitride-oxide) on any exposed surfaces of said second floating gate material and said trench dielectric material within said core area and said periphery area;

P. patterning a masking material comprised of photoresist material to remain on said floating gate dielectric material within said core area while exposing said floating gate dielectric material on said first and second floating gate materials within said periphery area;

Q. etching away said floating gate dielectric material and said first and second floating gate materials within said periphery area to expose said semiconductor substrate of said periphery active device area and to expose said trench dielectric material filling said second set of STI openings within said periphery area;

R. performing a dip-off etch of said trench dielectric material filling said second set of STI openings within said periphery area to expose corners of said semiconductor substrate of said periphery active device area adjacent said second set of STI openings;

wherein approximately 300 angstroms to about 400 angstroms of said trench dielectric material is etched away during said dip-off etch of said step R to expose said corners of said semiconductor substrate;

S. forming a dummy dielectric with said semiconductor substrate of said periphery active device area including said exposed corners of said periphery active device area adjacent said second set of STI openings, and etching away said dummy dielectric from said semiconductor substrate for further rounding said exposed corners of said periphery active device area;

wherein said dummy dielectric material is comprised of silicon dioxide (SiO$_2$) having a thickness of about 300 angstroms;

T. etching away said masking material from said core area;

U. forming a gate dielectric material comprised of silicon dioxide (SiO$_2$) on said periphery active device area;

V. depositing a control gate material comprised of polysilicon on said floating gate dielectric material within said core area and on said gate dielectric material within said periphery area;

W. patterning said tunnel dielectric material, said first and second floating gate materials, said floating gate dielectric material, and said control gate material within said core active device area to form a gate stack of a flash memory cell within said core area, and patterning said gate dielectric material and said control gate material within said periphery area to form a gate stack of a MOSFET (metal oxide semiconductor field effect transistor) within said periphery area;

X. implanting a dopant into exposed regions of said core active device area to form a drain bit line junction and a source bit line junction of said flash memory cell, and into exposed regions of said periphery active device area to form a drain junction and a source junction of said MOSFET; and Y. forming silicide simultaneously with said control gate material of said gate stacks of said flash memory cell and of said MOSFET, and with said drain and source bit line junctions of said flash memory cell, and with said drain and source junctions of said MOSFET.

* * * * *